United States Patent
Forinash et al.

(10) Patent No.: US 6,839,242 B2
(45) Date of Patent: Jan. 4, 2005

(54) RECONFIGURABLE CIRCUIT MODULES

(75) Inventors: John M. Forinash, Tucson, AZ (US);
Peter A. Bigot, Tucson, AZ (US); John D. Jensen, Tucson, AZ (US); Gary E. Spivey, Tucson, AZ (US)

(73) Assignee: Rincon Research Corporation, Tucson, AZ (US)

( * ) Notice: Subject to any disclaimer, the term of this patent is extended or adjusted under 35 U.S.C. 154(b) by 0 days.

(21) Appl. No.: 10/365,777

(22) Filed: Feb. 13, 2003

(65) Prior Publication Data

US 2004/0160746 A1 Aug. 19, 2004

(51) Int. Cl.⁷ .................................................. H06K 7/10
(52) U.S. Cl. .................. 361/760; 361/797; 361/790; 361/729; 439/65; 439/638
(58) Field of Search .................. 361/760, 752, 361/797, 790, 729, 733, 784, 785, 803, 730; 439/65, 638

(56) References Cited

U.S. PATENT DOCUMENTS

| | | | |
|---|---|---|---|
| 4,972,470 A | * 11/1990 | Farago | 713/192 |
| 5,583,749 A | 12/1996 | Tredennick et al. | |
| 5,691,885 A | * 11/1997 | Ward et al. | 361/735 |
| 5,901,332 A | 5/1999 | Gephardt et al. | |
| 5,941,714 A | * 8/1999 | Gorbet et al. | 439/38 |
| 6,043,558 A | 3/2000 | Manning | |
| 6,198,241 B1 | * 3/2001 | Calamatas | 318/434 |
| 6,344,972 B2 | * 2/2002 | Estieule et al. | 361/753 |
| 6,477,593 B1 | 11/2002 | Khosrowpour et al. | |
| 6,606,011 B2 | * 8/2003 | Anthony et al. | 333/12 |

* cited by examiner

Primary Examiner—Kamand Cuneo
Assistant Examiner—Hung S. Bui
(74) Attorney, Agent, or Firm—Quarles & Brady Streich Lang LLP (57) ABSTRACT

A reconfigurable circuit module comprises edge connectors for connecting with other reconfigurable circuit modules to form multi-dimensional arrays. Programmable devices such as FPGAs, CPLDs, etc. residing on the reconfigurable circuit modules control electric signal path functionality. An embedded controller microprocessor negotiates signal path compatibility between adjacent modules, preventing two or more programmable devices from simultaneously driving the same signal path.

21 Claims, 10 Drawing Sheets

Reconfiguration Control Signals

| | | |
|---|---|---|
| PRES | Xmit Presence | -62- |
| NPRES | Receive Presence | -64- |
| BTX | Xmit Sequence | -66- |
| BRX | Receive Sequence | -68- |
| RPT | Xmit Request to Reconfigure | -70- |
| NRTP | Receive Reconfiguration Request | -72- |
| PRP | Xmit Processed Request | -74- |
| NPRNP | Receive Processed Confirmation | -76- |
| PRA | Xmit Reconfiguration Approval | -78- |
| NPRA | Receive Approval | -80- |

RECONFIGURABLE CIRCUIT MODULES

BACKGROUND OF THE INVENTION

1. Field of the Invention

This invention is related in general to the field of electronic circuit boards. In particular, the invention comprises utilizing a microprocessor to negotiate communication protocols between a plurality of reconfigurable circuit modules.

2. Description of the Prior Art

It is very common to use electronic circuit boards to hold programmable devices such as Field Programmable Gate Arrays ("FPGAs"), Complex Programmable Logic Devices ("CPLDs"), Digital Signal Processors ("DSPs"), or microprocessors ("uPs"). These circuit boards are often inserted into a motherboard or back-plane which provides communications connectivity with other devices, including a controller computer, and power connections. Connections between the circuit boards and the back-plane usually conform to an industry standard such as PCI, VME, or ISA. Each circuit board connects directly to the back-plane and communication between circuit boards must pass over the back-plane. The number of circuit boards which can be connected together as well as their spatial orientation is dictated by the number and location of connectors on the back-plane.

Circuit boards which are designed to communicate with a computing system over the back-plane must have software drivers written for them. Additionally, circuit boards must have connectors which conform to the relevant industry standard protocol. It would be advantageous to be able to configure circuit boards in a manner which eliminates the limitations of using industry standard protocols and specialized software drivers.

One patent, Gephardt et al. U.S. Pat. No. 5,901,332, discloses configuring a data bus into a plurality of reconfigurable sub-busses. A data-bus controller is provided to control the communication pathway of the sub-busses, with an information flow template being stored in a memory device. Another salient patent, Manning U.S. Pat. No. 6,043,558, discloses a method of connecting electronic components with two edge connectors, one edge adapted to receive power and the second edge adapted to receive communications signals. While outside the restrictions inherent in industry standard protocols, these approaches still require communications between individual circuit boards to traverse the back-plane.

Khosrowpour et al., U.S. Pat. No. 6,477,593, discloses an input/output bridge including a first and second buss and an interconnected stack of circuit boards connected to the first and second busses. Tredennick et al., U.S. Pat. No. 5,583,749, teaches a daughtercard for use in a reconfigurable apparatus, comprised of electrical connections along one edge and electrical connections on the opposite edge. The daughtercards are stacked vertically, allowing communication signals to traverse between the daughtercards. However, both the Khosrowpour and Tredennick inventions still require connecting their respective stacks of circuit boards to a motherboard or back-plane. It would be advantageous to connect circuit boards directly together to form larger functional circuits independent of a motherboard or back-plane.

A commercially available product called ComBlock™, advertised by MSS™, provides circuit boards or modules with multiple connectors. These multiple connectors allow circuit boards to be directly connected together in multi-dimensional arrays. Once assembled, the array need not be connected to a motherboard or back-plane. Rather, the array is controlled by a serial or network interface. The modules are either pre-programmed with desired functionality or include FPGAs which can be programmed by the end user. The electrical pathways of the connectors are usually controlled by programmable input/output pins of programmable devices such as FPGAs and conform to a manufacturer's standard. This prevents electronic devices from different, adjacent modules from attempting to simultaneously drive signals over the same electrical pathway, which could result in damage to one or more of the electronic devices.

End users who program the electronic devices of customizable modules must be careful to follow the connectivity convention of the manufacturer. While highly utilitarian, the ComBlock does not protect the end user from damaging electronic devices by incorrectly configuring modules. It would be advantageous to have a device which negotiates communication pathways between circuit boards and prevents more than one device from attempting to drive an electrical signal pathway.

Therefore, it is desirable to provide a means for connecting circuit boards together in multi-dimensional arrays and provide a means for negotiating the electrical pathways between them.

SUMMARY OF THE INVENTION

This invention is based on utilizing multiple connectors on reconfigurable circuit boards ("modules") to allow the modules to be arranged in scalable multi-dimensional arrays. Interconnected modules provide high speed data transfer pathways between adjacent modules without the need for a controlling motherboard or back-plane. Communication and control signals arrive via a standard serial or network interface, eliminating the need for specialized software drivers.

Adjacent modules exchange information about their respective electronic devices and associated electrical pathways. A controller is utilized to negotiate the pathway configuration between adjacent modules to prevent the destruction of electrically coupled electronic devices.

Various other purposes and advantages of the invention will become clear from its description in the specification that follows and from the novel features particularly pointed out in the appended claims. Therefore, to the accomplishment of the objectives described above, this invention comprises the features hereinafter illustrated in the drawings, fully described in the detailed description of the preferred embodiments and particularly pointed out in the claims. However, such drawings and description disclose just a few of the various ways in which the invention may be practiced.

DESCRIPTION OF THE PREFERRED EMBODIMENTS

Figure 1:
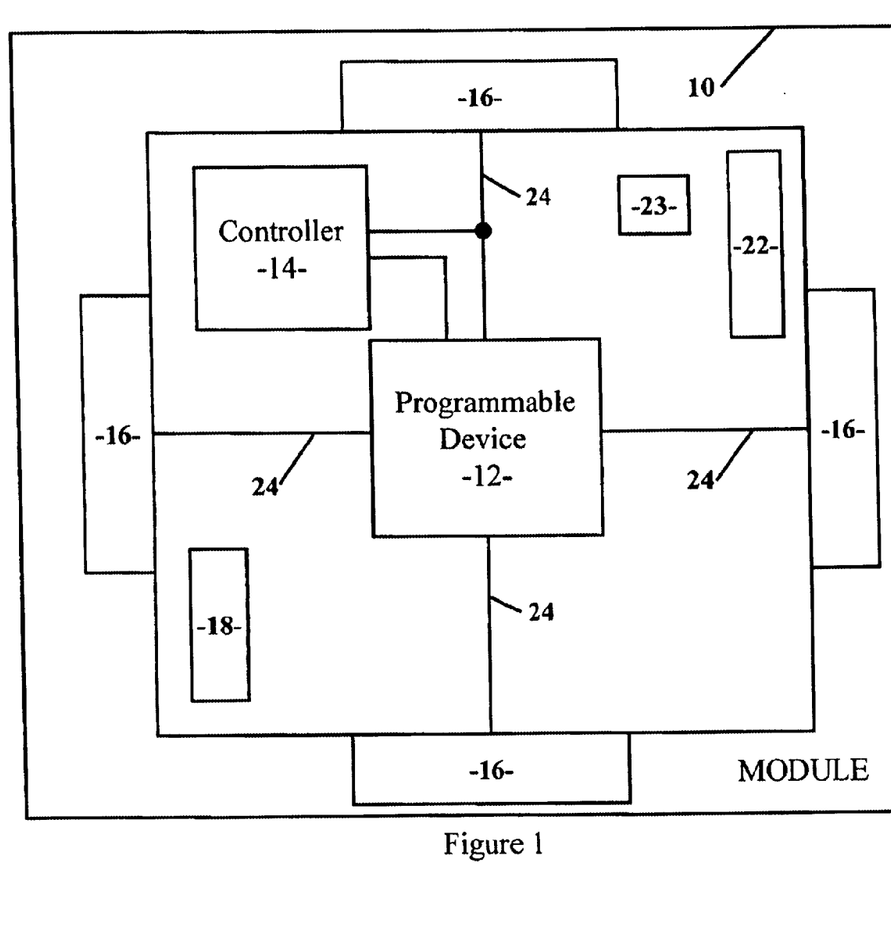
FIG. 1 is an illustration indicating the programmable device, the embedded configuration controller, the electrical signal pathways, the connectors, and the optional embedded communication microprocessor and communication link of a reconfigurable circuit module, according to the preferred embodiment of the invention.

As a general overview of the invention, FIG. 1 shows a rectangular reconfigurable circuit module 10 including at least one programmable device 12, a controller 14, edge connectors 16, and electrical pathways 24. While the preferred embodiment of the invention utilizes a field programmable gate array ("FPGA") as the programmable device 12, an Application Specific Integrated Circuit ("ASIC"), digital signal processor ("DSP"), complex programmable logic device ("CPLD"), micro-processor ("uP"), or other electronic component may be used. The controller 14 may be a microprocessor, a state-machine, or other processing device. An optional external communications link 22 and an embedded communications processor 23 may be included to allow an external device to provide command and control of the module 10, and to receive data and status information. Additionally, optional upward facing connectors 18 may be provided.

The physical shape of the module 10 is designed to allow connectors 16 to be placed along its periphery. Electrical signals enter the module at the edge connector 16 and traverse the pathways 24, arriving at one or more programmable devices 12 or exiting the module at another connector. Electrical signals can also originate at a programmable device and exit the module at any connector.

In the preferred embodiment of the invention, the module 10 is rectangular in shape and includes four edge connectors 16, one on each edge. However, the invention is not limited to a specific number of connectors. The same rectangular module may only have one, two, or three edge connectors 16, or may have more than four edge connectors placed along its periphery, with multiple edge connectors on a side.

Figure 2:
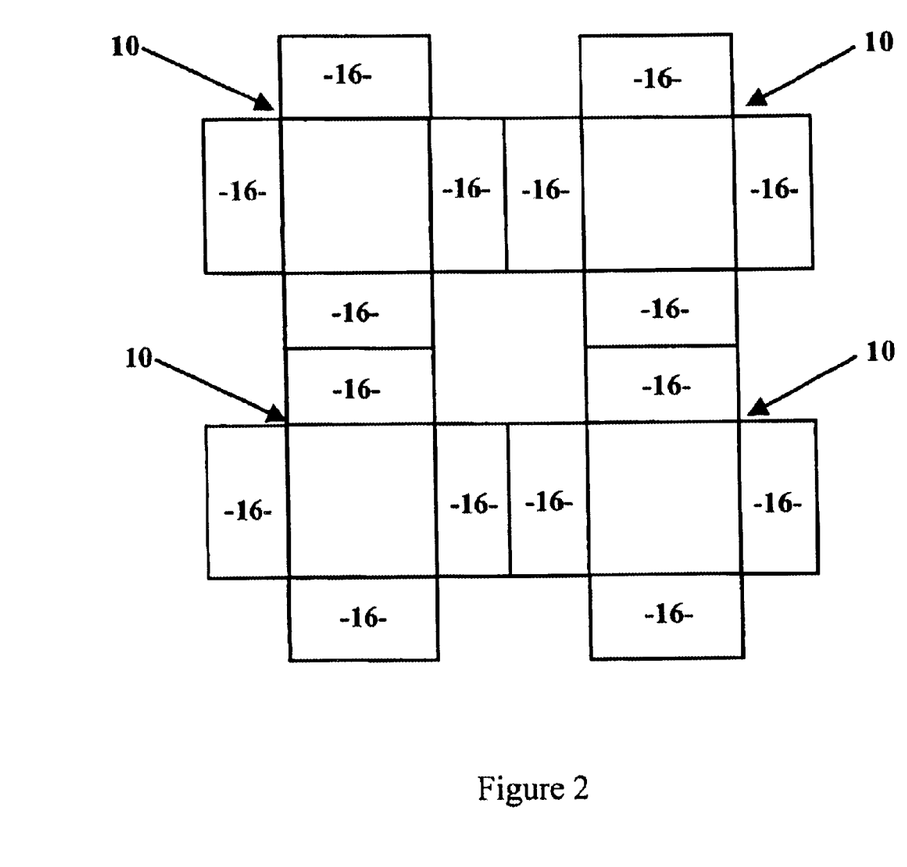
FIG. 2 is an illustration portraying several reconfigurable circuit modules connected to form a two-dimensional array.

In the preferred embodiment, if more than one connector is provided, it is advantageous that each connector have a comparable number of electrical pathways 24 and that the pathways be identically configured. This allows additional modules to be attached to any edge connector 16 and have access to electrical signals arriving from any other connector. Alternatively, the pathways 24 need not be explicitly configured as input/output conduits, but rather follow a consistent standard from board to board. It is not required, however, for each connector 16 to be identical. Some connectors may be female and others may be male. Standardized modules including two male and two female connectors would facilitate the combining of multiple modules into two-dimensional arrays, as illustrated in FIG. 2.

Figure 3:
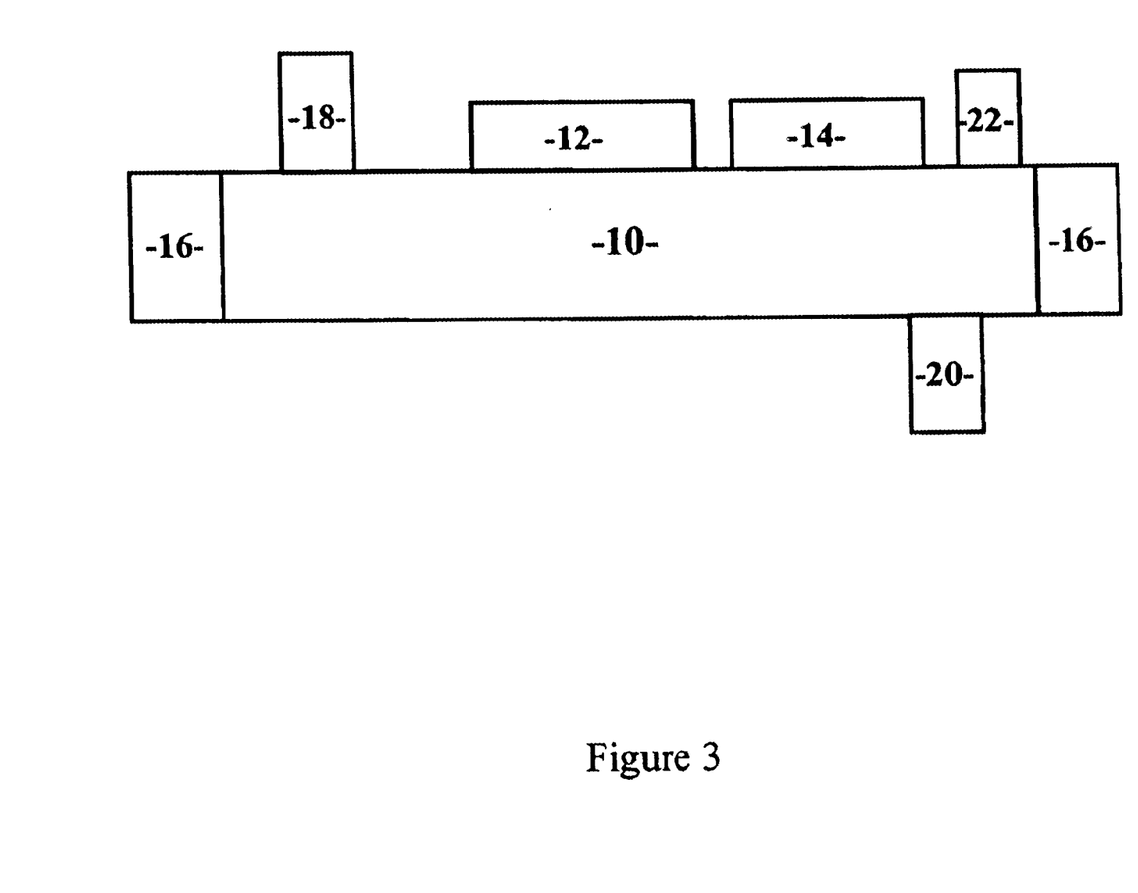
FIG. 3 is a side view of the reconfigurable circuit module of FIG. 1 indicating optional upward facing connectors and downward facing connectors.

Connectors are not restricted to being placed along the periphery of the modules. FIG. 3 illustrates a side view of the rectangular module 10. One or more upward facing connectors 18 may be placed on its upper surface and additional downward facing connectors 20 may be placed on its lower surface. A rectangular module 10 with connectors 16 on each edge, upper connectors 18, and lower connectors 20 allow modules to be connected in three-dimensional arrays.

Referring back to FIG. 1, the optional embedded communications processor 22 and external communications link 23 provide a means for connecting one or more modules 10 to external devices, such as computer controllers. The communications processor 22 is used to manage incoming and outgoing communications utilizing a communications protocol such as TCP/IP. The external communications link 23 includes a connector for coupling the module 10 to external communications devices, such as a network cable. Command and control signals generated by an external device arrive at the communications link 23 and is processed by the embedded communications processor 22. Data and status information is transmitted from the module via the same communication path. Each module 10 in an array may posses the communications processor 22 and the communication link 23. The external communications path might be a high-speed local area network ("LAN"), a phone line, or a satellite data link.

Multiple modules may be simultaneously connected to external devices. However, for external communications, an array of modules need have only one external communication path. Once received by a module 10 in an array, command and control signals are routed to the appropriate modules over the edge connectors by the embedded communications processor 22. Likewise, data and status transmitted by modules, comprising an array, which do not have external communication paths arrive at the communications processor 22 via the edge connectors 16.

In the preferred embodiment of the invention, the embedded communication processor 22 and the external communication link 23 is designed to accept signals conforming to a standard communications protocol, such as Transmission Control Protocol/Internet Protocol ("TCP/IP"), over an Ethernet communications network. This protocol and interface is supported by a variety of communication and computing devices. Using a standard communication protocol eliminates the requirement of providing specialized drivers written for each module configuration.

It should be noted than some applications utilizing one or more modules 10 may not require communication with external devices. In such instances, modules or arrays of modules are configured to run internal programs without external control. Data may be stored in memory residing on one or more modules or may be displayed via light emitting diodes ("LEDs"), liquid crystal displays ("LCDs"), or other visual display devices.

Figure 4:
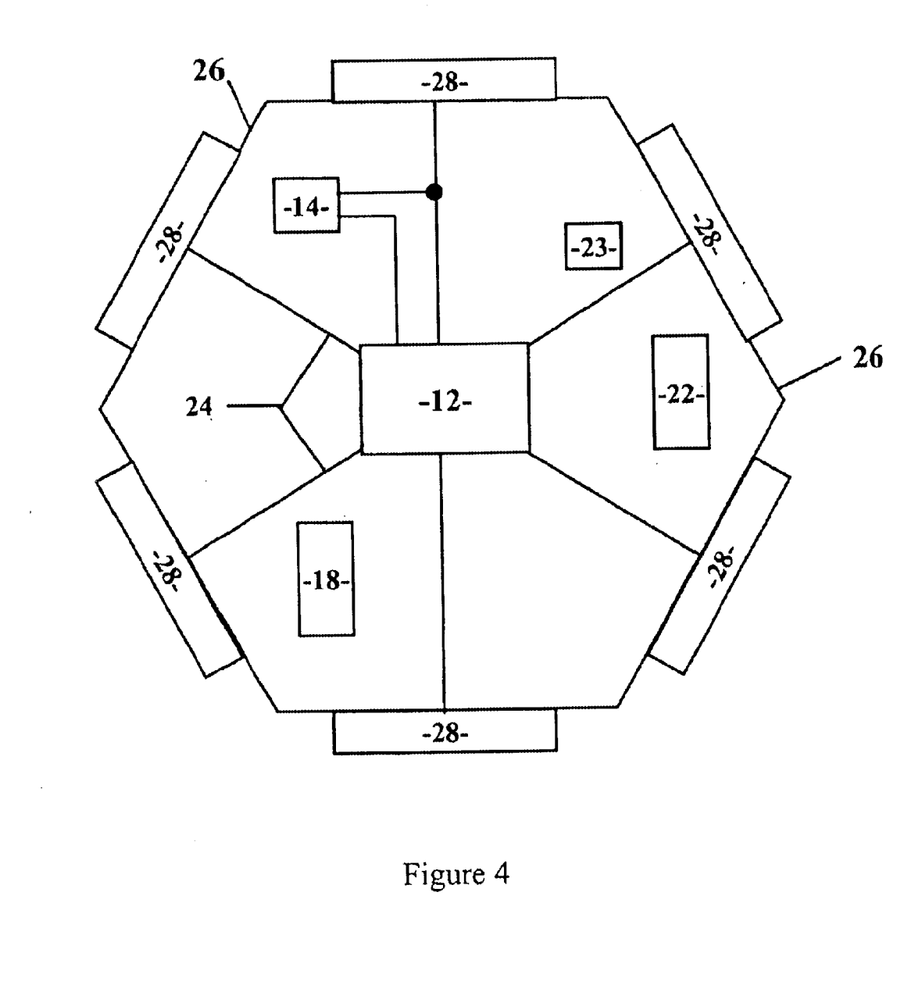
FIG. 4 is an illustration of a six-sided reconfigurable circuit module.

The invention which is the subject of this application is not restricted to rectangular shapes. FIG. 4 illustrates a hexagonally shaped module with six sides 26 and six connectors 28 placed along its periphery, one on each edge. In this second embodiment of the invention, communication pathways between modules form a three-dimensional array, even though the modules are arranged along a two-dimensional plane. Other potential shapes for modules 10 are triangles, octagons, etc.

Programmable devices 12 often have programmable input/output pins. This allows a user to determine the functionality of pathways 24. If a programmable device drives electrical signals along a particular pathway, the corresponding input/output pin of the programmable device is configured as an output pin. Conversely, if a programmable device only receives electrical signals from a particular pathway, the corresponding input/output pin is configured as an input pin. However, sometimes it is desirable to have input/output pins configured as bi-directional devices. This allows the programmable device to drive electrical signals along a pathway 24 some of the time and receive signals along the same pathway at other times.

A problem arises if more than one programmable device 12 attempts to drive a pathway 24 at the same time. If two or more programmable devices simultaneously send electrical signals along the same pathway, one or more of the programmable devices could be damaged or effectively destroyed by excessive electrical current.

If multiple programmable devices are on the same module, it is fairly straightforward to design the module 10 and program the programmable devices in a manner that precludes simultaneous driving of a signal pathway. However, if multiple modules 10 are connected to form a multi-dimensional array, the difficulty in preventing simultaneous driving of a pathway increases significantly.

Figure 5A:
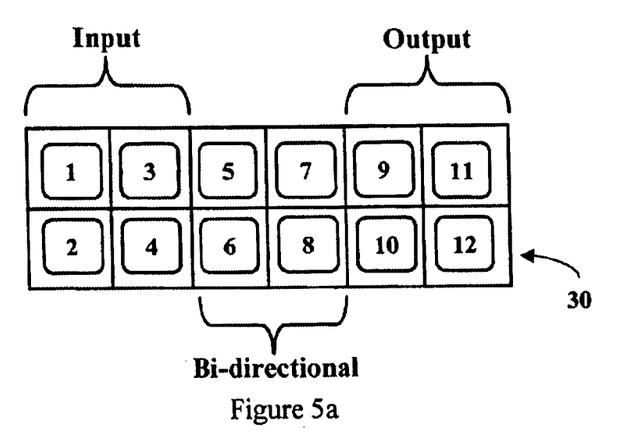
FIG. 5a is an illustration of a sample pinout of a male connector.
Figure 5B:
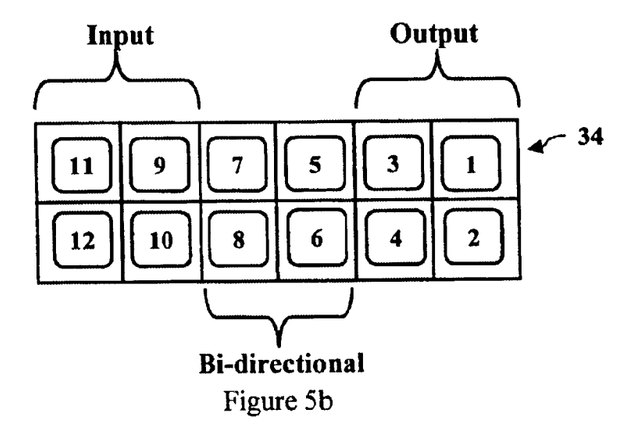
FIG. 5b is an illustration of a sample pinout of a female connector, intended to couple with the male connector of FIG. 5b.

One approach is to require each connector 16 of each module 10 to conform to a pinout standard whereby the functionality of each pathway is constrained. Turning to FIG. 5a, a male connector 30 includes twelve signal pathways 32. Pathways 1–4 may be constrained to be output paths, pathways 9–12 may be limited to input paths, and pathways 5–8 may bi-directional paths. FIG. 5b illustrates a female connector 34 intended to couple with the male connector 30. Pathways 1–4 are constrained as input paths, pathways 9–12 are limited to output paths, and pathways 5–8 are bi-directional. If this standard is adopted for the module 40 of FIG. 6, the electrical pathways 24 are controlled by the programmable input/output pins of the programmable devices 12. It should be noted that the selection of a 12-pin male connector 30 (FIG. 5a) and a 12-pin female connector 34 (FIG. 5b) is provided for illustration purposes. The connectors 30,34 are not limited to twelve pins, nor or specific pins limited to input, output, or bi-directional.

Figure 6:
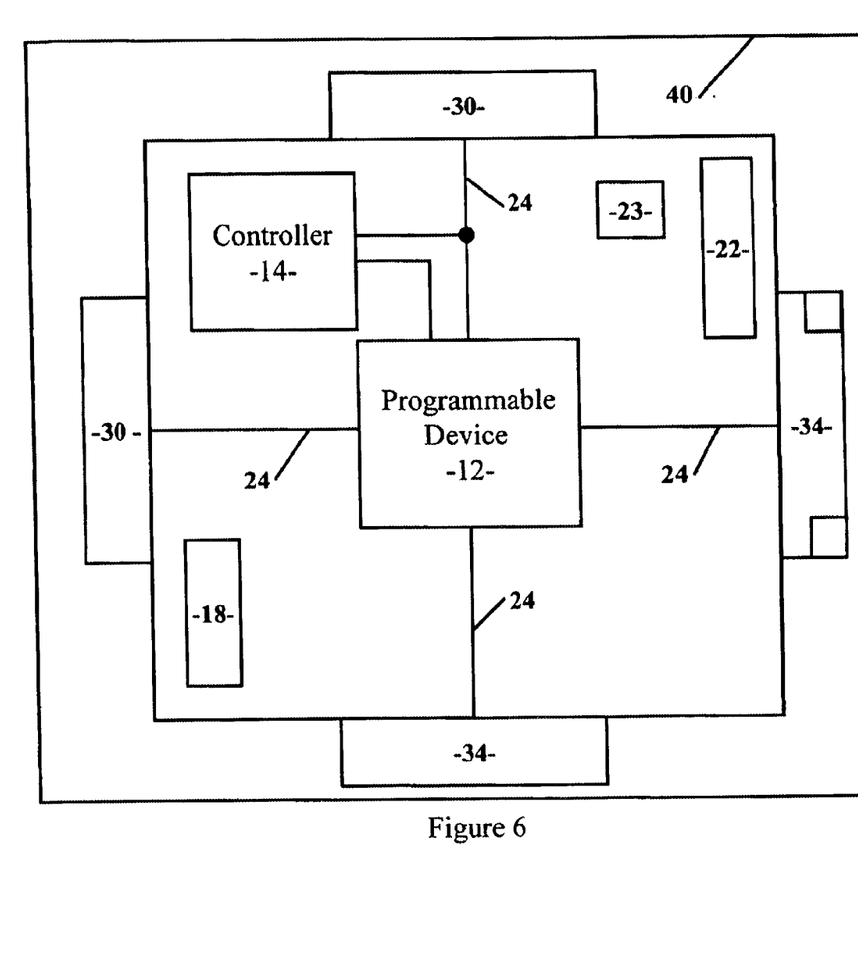
FIG. 6 is an illustration of a reconfigurable circuit module with male and female connectors, according to the invention.

Requiring a pinout standard reduces the flexibility of the configuring the electric components which form the module 40. Additionally, if a user fails to adhere to the required pinout standard, the potential for damaging a programmable device or other electrical component still exists.

In the preferred embodiment of the invention, referring once again to FIG. 1, the preferred embodiment of the invention includes an embedded configuration controller 14 which is responsible for detecting and negotiating the functionality and configuration of electrical pathways 24 of adjacent, connected modules. This ensures that when two or more modules 10 are connected together, a potentially damaging configuration is avoided. Other embodiments of the invention may utilize ASICs, FPGAs, CPLDs, or other electronic devices to perform the functionality of the embedded controlling microprocessor. If two connected modules are configured in a manner which may allow more than one programmable device 12 to simultaneously drive a pathway 24, the connection is interrupted by the microprocessor 14. Optionally, an error message will be transmitted to external devices via the external embedded communications processor 22 and the external communication link 23.

Figure 7:
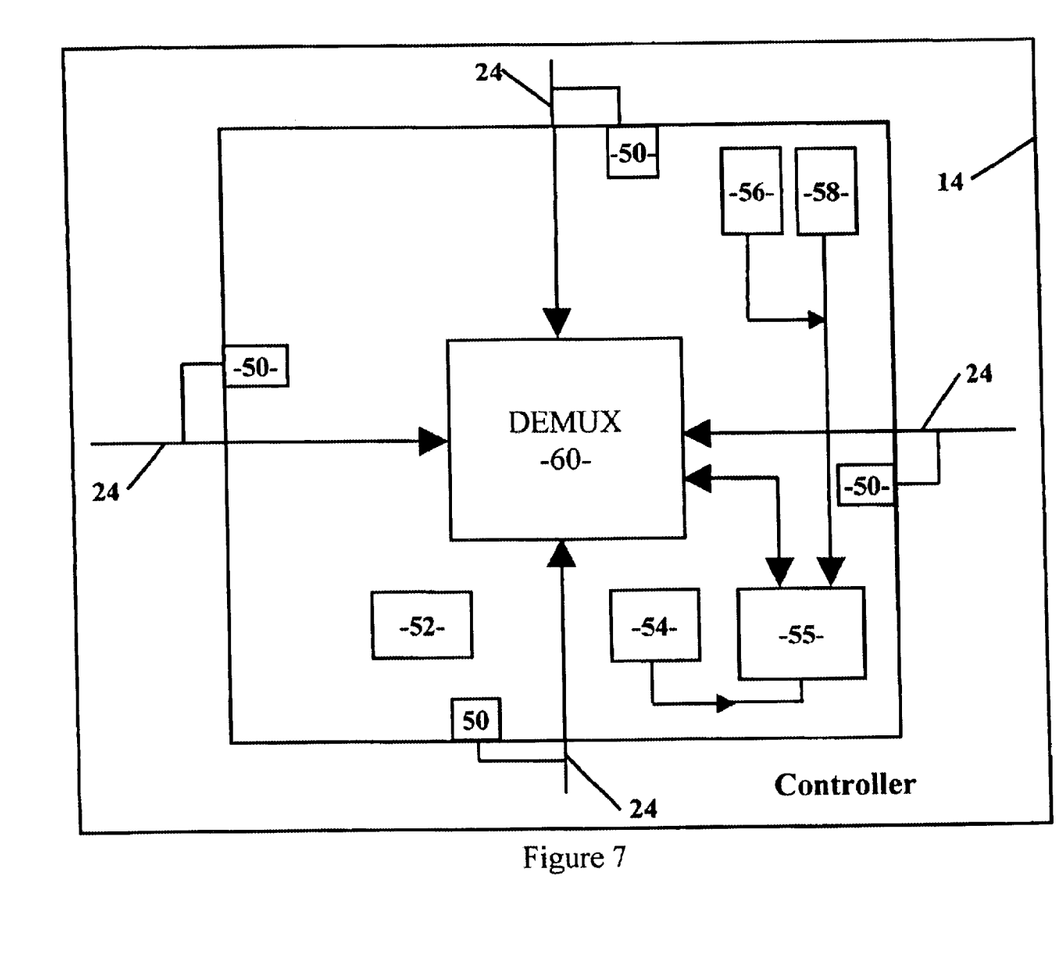
FIG. 7 is a block diagram portraying the functional units of the embedded configuration controller, according to the invention.

FIG. 7 is a block diagram of the functional units of the embedded configuration controller 14. The controller 14 may be a commercially available programmable device which includes interrupt pins 50, a frequency generator 52 ("clock"), a sequence generator 54 ("beacon"), workspace 55, program memory space 56, and data memory space 58. Alternatively, the controller microprocessor could be a programmable device which has been configured to include these functional units. In an alternate embodiment of the invention, some of the functional units, such as clock, beacon, or data memory space, may be discrete electronic components.

The beacon 54 generates and transmits a sequence of bits to each connector 16,18,20 of the module 10. The sequence contains a module identifier and, in the preferred embodiment, a PLD configuration specification. Each module 10 listens for transmitted sequences from other, connected, modules. A demultiplexor ("demux") 60 may be used to cycle through the module's connectors 16,18,20, listening to each connector and associated module in turn. The algorithm for negotiating pinout configurations is stored in the program memory space 56. The table shown in FIG. 8 lists the signals which are generated, received, and recognized by the embedded controller microprocessor.

Figure 8:
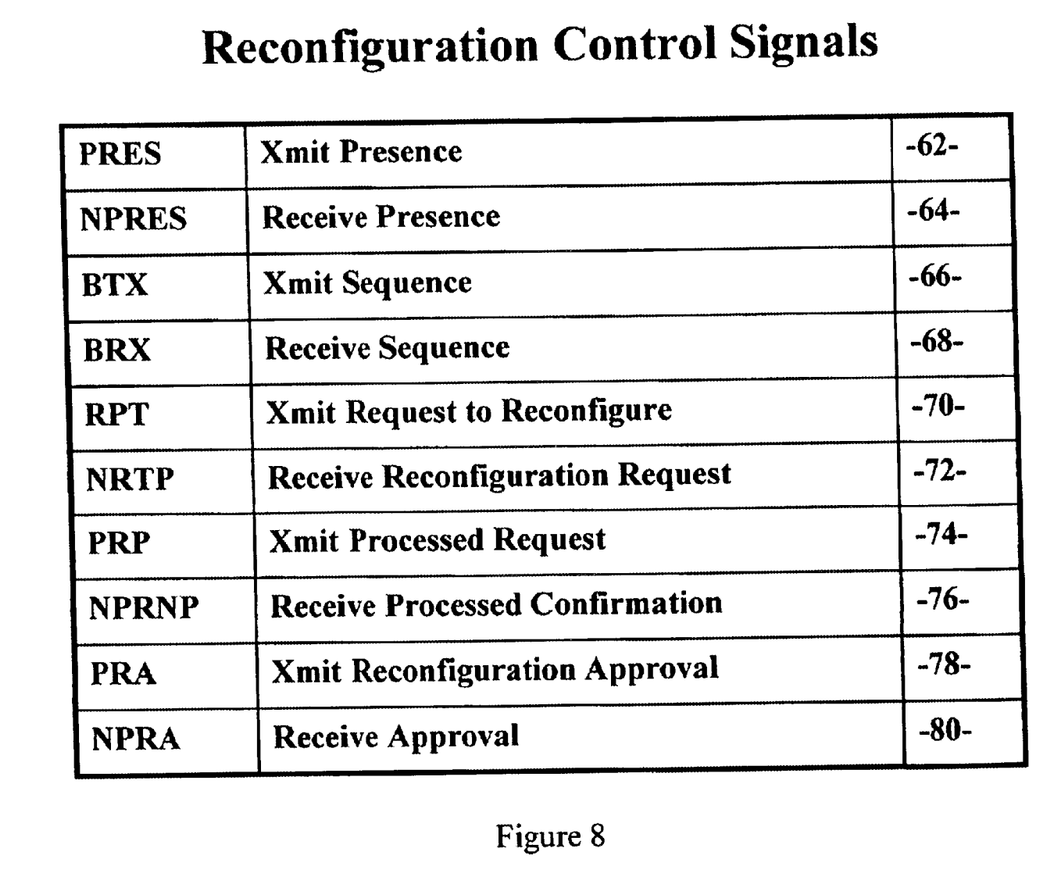
FIG. 8 is a table listing the input and output signals utilized for the negotiation of connections between multiple reconfigurable circuit modules, according to the invention.

Five output signals, PRES 62, BTX 66, RTP 70, PRP 74, and PRA 78 are used to transmit information from the instant module 10 to attached modules. PRES 62 is an output signal designed to announce the presence of the instant module 10. BTX 66 is the generated sequence containing the module identifier and, in the preferred embodiment, a PLD configuration specification. RTP 70 announces that the instant module 10 is attempting to reconfigure its PLDS, requiring a renegotiation of the input/output pins. If a reconfiguration request from an attached board has been processed, PRP 74 is transmitted. PRA 78 indicates that the instant module 10 has not only processed a request from an attached module, but accepts and approves of the proposed reconfiguration.

Likewise, the embedded controller microprocessor 14 receives and recognizes five input signals from each neighboring module, NPRES 64, BRX 68, NRTP 72, NPRP 76, and NPRA 80, which are the five output signals indicated above transmitted by an attached module. NPRES 64 indicates the physical presence of a connected module. BRX 68 is the input line which receives transmitted beacons from attached modules. NRTP 72 corresponds to a transmitted announcement indicating another module is attempting to reconfigure its programmable devices. Reception of an NRTP 76 signal generates a program interrupt to alert the controller 14 that action is required. An acknowledgement that another module has processed the instant module's 10 request for reconfiguration arrives on NPRP 80. Approval for reconfiguration is indicated by NPRA 82. In an alternate embodiment, resource limitations may obviate the need for the PRP 74 and NPRPn 76 signals. In that situation, the PRA 78 and NPRAn 80 may be utilized to indicate that the reconfiguration request has been processed and accepted, and the NPRA signal generates an interrupt to indicate that the request has been accepted.

Figure 9:
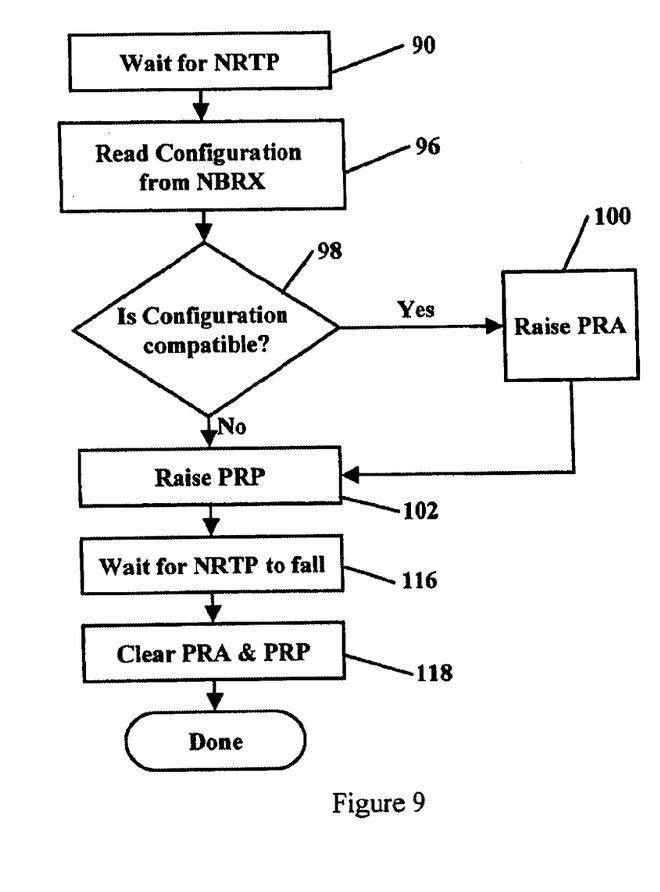
FIG. 9 is a flow-chart illustrating the algorithm of receiving and processing a pathway reconfiguration request, according to the invention.
Figure 10:
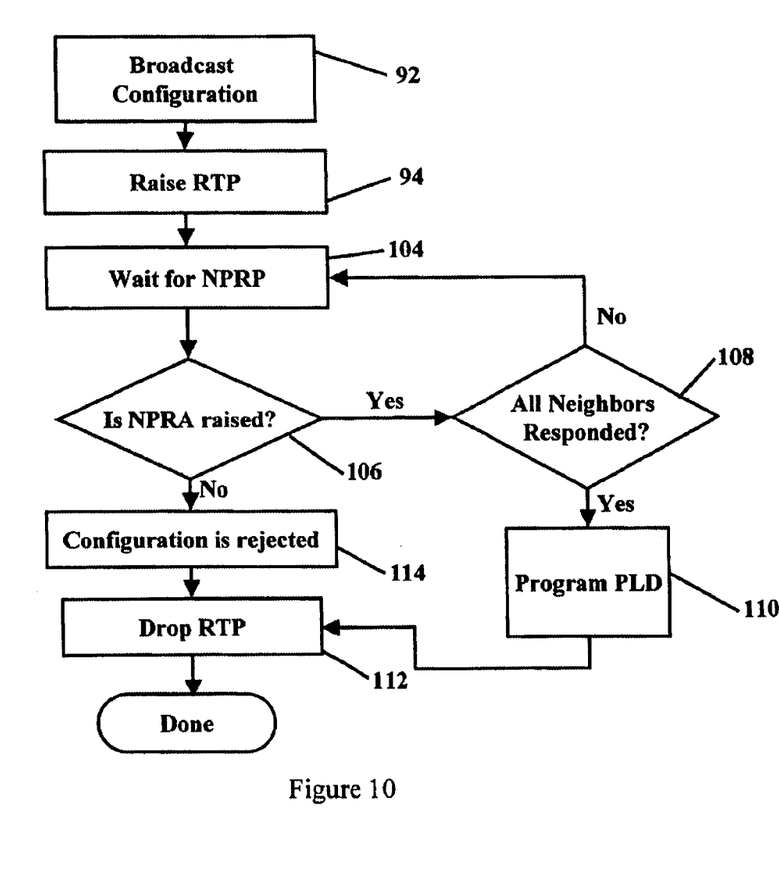
FIG. 10 is a flow-chart illustrating the algorithm of requesting a pathway reconfiguration, according to the invention.

FIGS. 9 and 10 illustrate the algorithm required to establish communication between connected modules. FIG. 9 is the algorithm representative of a module 10 responding to a request for reconfiguration from a neighboring module. FIG. 10 is the algorithm representative of the neighboring module's request for pathway 24 reconfiguration. The instant module 10 waits 90 for a request for reconfiguration. Configuration information is broadcast in a beacon message 92 and the signal RTP 70 is raised 94 by the neighboring module (FIG. 10). The instant module 10 responds to a raised NRTP signal by reading 96 the broadcast configuration information arriving in signal NBRX. The controller 14 then determines 98 if the proposed pathway configuration is compatible with the pathway 24 configuration of the instant module 10. If the proposed configuration is compatible, the signal PRA is raised 100. In either case, the signal PRP is raised 102 by the controller.

Meanwhile, the controller of the neighboring module has been waiting 104 for to receive a valid NPRP signal. Once received, the status of NPRA is evaluated 106. If NPRA has been raised, the controller then determines 108 if responses have arrived from all neighboring modules. If yes, the controller programs 110 the programmable devices with the proposed configuration and then drops 112 the signal RTP. If any neighboring modules have not yet responded, the algorithm returns to waiting for NPRP signals 104. If the NPRA signal was not raised when the NPRP signal was received, the configuration is rejected 114 and the signal RTP is dropped 112. Once the instant module 10 detects 116 that NRTP has fallen, the controller 14 clears 118 signals PRA and PRP.

During the configuration compatibility phase 98 of the algorithm, the controller microprocessor 14 loads a negotiation algorithm into its workspace 55 (FIG. 7). The negotiation algorithm compares the pinout configuration arriving in the beacon 54 from the connected module and verifies compatibility with the pinout configuration of the instant module 10. If the pinout configurations are found to be compatible, the instant module 10 transmits the approval signal PRAn 78.

Others skilled in the art of making electronic circuit boards may develop other embodiments of the present invention. The embodiments described herein are but a few of the modes of the invention. Therefore, the terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A reconfigurable circuit module, comprising:
   a circuit board;
   at least one programmable device possessing a plurality of programmable input/output pins;
   at least one connector;
   a plurality of electrical signal pathways; and
   an embedded controller for negotiating electrical signal pathway compatibility between the reconfigurable circuit module and another, connected, reconfigurable circuit module whereby the plurality of electrical signal pathways and the at least one connector constitute a pinout, said pinout being established by said plurality of programmable input/output pins.

2. The reconfigurable circuit module of claim 1, wherein said controller is a microprocessor.

3. The reconfigurable circuit module of claim 1, wherein said controller is a state-machine.

4. The reconfigurable circuit module of claim 1, wherein said reconfigurable circuit module is rectangular in shape and said at least one connector comprises four edge connectors, each of said four edge connectors being positioned along a side of said rectangular shaped reconfigurable circuit module.

5. The reconfigurable circuit module of claim 1, wherein said at least one connector further comprises at least one upward facing connector and at least one downward facing connector.

6. The reconfigurable circuit module of claim 1, wherein said reconfigurable circuit module is hexagonal in shape and said at least one connector comprises six edge connectors, each of said six edge connectors being positioned along a side of said hexagonal shaped reconfigurable circuit module.

7. The reconfigurable circuit module of claim 1, wherein said reconfigurable circuit module is octagonal in shape and said at least one connector comprises eight edge connectors, each of said eight edge connectors being positioned along a side of said octagonal shaped reconfigurable circuit module.

8. The reconfigurable circuit module of claim 1, wherein said reconfigurable circuit module is triangular in shape and said at least one connector comprises three edge connectors, each of said three edge connectors being positioned along a side of said triangular shaped reconfigurable circuit module.

9. The reconfigurable circuit module of claim 1, wherein said programmable device is a complex programmable logic device ("CPLD").

10. The reconfigurable circuit module of claim 1, wherein said programmable device is a field programmable gate array ("FPGA").

11. The reconfigurable circuit module of claim 1, wherein said programmable device is a digital signal processor ("DSP").

12. The reconfigurable circuit module of claim 1, wherein said programmable device is a micro-processor ("uP").

13. The reconfigurable circuit module of claim 1, further comprising:
    an embedded communications processor; and
    an external communication link wherein said embedded communications processor and said external communication link constitute an external communications channel.

14. The reconfigurable circuit module of claim 13, wherein said external communication channel utilizes a standard communication protocol.

15. The reconfigurable circuit module of claim 14, wherein said standard communication protocol is Transmission Control Protocol/Internet Protocol ("TCP/IP").

16. The reconfigurable circuit module of claim 4, wherein at least one of said four edge connectors is a male connector.

17. The reconfigurable circuit module of claim 4, wherein at least one of said four edge connectors is a female connector.

18. A method of forming a multi-dimensional array of reconfigurable circuit modules comprising the steps of:
    providing a first reconfigurable circuit module, said first reconfigurable circuit module comprising a circuit board, a first set of at least one programmable device possessing a plurality of programmable input/output pins, at least one male connector, a plurality of electrical signal pathways, and a first embedded controller for negotiating electrical signal pathway compatibility;
    providing a second reconfigurable circuit module, said second reconfigurable circuit module comprising a circuit board, a second set of at least one programmable device possessing a plurality of programmable input/output pins, at least one female connector, a plurality of electrical signal pathways, and a second embedded controller for negotiating electrical signal pathway compatibility; and
    connecting said first reconfigurable circuit module to said second reconfigurable circuit module by inserting said at least one male connector into said at least on female connector.

19. The method of claim 18 wherein said first programmable device is a field programmable gate array ("FPGA").

20. The method of claim 18 wherein said first embedded controller is a microprocessor.

21. The method of claim 18 wherein said first embedded controller is a state-machine.

* * * * *